United States Patent
Buck

(10) Patent No.: US 6,445,091 B1
(45) Date of Patent: Sep. 3, 2002

(54) INTEGRATED SEMICONDUCTOR CIRCUIT HAVING AT LEAST TWO SUPPLY NETWORKS

(75) Inventor: Martin Buck, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/197,369

(22) Filed: Nov. 20, 1998

(30) Foreign Application Priority Data

Nov. 20, 1997 (DE) .......................... 197 51 540

(51) Int. Cl.[7] .......................................... H03K 19/003
(52) U.S. Cl. ...................................... 307/130; 327/530
(58) Field of Search .............................. 307/42, 85, 86, 307/87, 130; 323/220; 327/111, 112, 530, 535

(56) References Cited

U.S. PATENT DOCUMENTS

| 4,978,905 A | * | 12/1990 | Hoff et al. ................... 323/314 |
| 5,059,822 A | * | 10/1991 | Dukes ......................... 307/443 |
| 5,319,260 A | * | 6/1994 | Wanlass ....................... 307/443 |
| 5,332,932 A | * | 7/1994 | Runaldue ...................... 307/443 |
| 5,438,277 A | * | 8/1995 | Sharpe-Geisler ............. 326/27 |
| 6,219,294 B1 | * | 4/2001 | Huber et al. ................ 365/226 |

FOREIGN PATENT DOCUMENTS

| DE | 19700988 A1 | 7/1997 |
| EP | 0545359 A2 | 6/1993 |

\* cited by examiner

*Primary Examiner*—Fritz Fleming
(74) *Attorney, Agent, or Firm*—Laurence A. Greenberg; Werner H. Stemer; Ralph E. Locher

(57) ABSTRACT

An integrated semiconductor circuit has at least two supply networks that are supplied independently of one another. The two supply networks include a first, load supply network, which is associated with a load circuit, and a second, driver supply network, which is associated with a driver circuit. Each supply network has a ground path with ground lines and a supply path with supply potential lines which are separate from the ground path. A compensating circuit is provided which alternatively couples the ground paths and/or the supply paths of the at least two supply networks to one another.

18 Claims, 2 Drawing Sheets

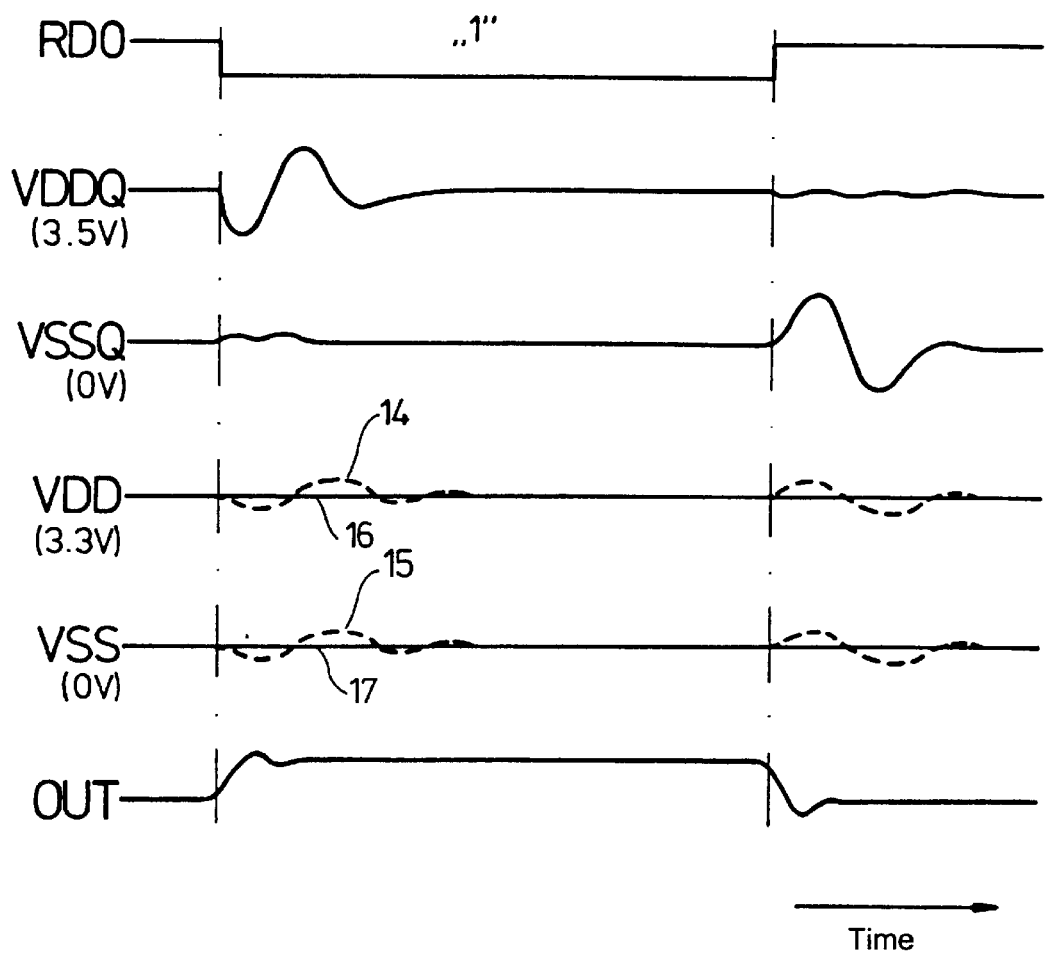

INTEGRATED SEMICONDUCTOR CIRCUIT HAVING AT LEAST TWO SUPPLY NETWORKS

BACKGROUND OF THE INVENTION

Field of the Invention

The invention relates to an integrated semiconductor circuit having at least two supply networks that are supplied independently of one another. The two supply networks include a first, load supply network, which is associated with a load circuit, and a second, driver supply network, which is associated with a driver circuit. Each supply network has a ground path with ground lines and a supply path with supply potential lines separate from the ground path.

Increasingly high clock frequencies in digital semiconductor chips, such as DRAM storage chips, impose ever shorter switching times on the output drivers provided in the semiconductor chip. These very short switching times are the cause of current surges during the switching time, which in turn cause voltage fluctuations in the supply networks of the semiconductor chip, and hence noise which can adversely affect the correct operation of the digital circuits produced on the semiconductor chip. In order to remedy these weaknesses, attempts have been made to develop the digital circuits such that they are as less sensitive to the effects of noise, but it has not been possible to achieve this without a loss of speed. In addition, an attempt was made to provide separate supply pins for supplying the output driver circuits (OCD = off chip driver), but this requires a separate voltage supply and hence increased circuitry.

SUMMARY OF THE INVENTION

It is accordingly an object of the invention to provide an integrated semiconductor circuit having at least two supply networks which overcomes the above-mentioned disadvantages of the prior art devices of this general type, in which the noise caused by current surges during switching of the driver circuits is considerably reduced in the integrated semiconductor circuit, even without a loss of speed.

With the foregoing and other objects in view there is provided, in accordance with the invention, an integrated semiconductor circuit, including: at least two supply networks supplied independently of one another including a load supply network associated with a load circuit and a driver supply network associated with a driver circuit, the at least two supply networks including ground paths and supply paths and each of the at least two supply networks has a ground path with ground lines and a supply path with supply potential lines separate from the ground path; and a compensating circuit alternatively coupling at least one of the ground paths and the supply paths of the at least two supply networks to one another.

According to the principle of the invention, a compensating circuit is provided which alternatively couples the ground paths and/or the supply paths of the at least two supply networks to one another. Expediently, the compensating circuit has a logic circuit which detects the load on one of the at least two supply networks in the form of a predetermined logic value (logic ONE or logic ZERO) and, in response to this, controls the coupling element. The coupling element is likewise provided in the compensating circuit, so as to make an electrical connection between the ground paths and/or the supply paths of the at least two supply networks.

If the load circuit disposed on the semiconductor chip reads a logic ONE, then, in this case, the positive supply potential of the driver circuits is loaded. If a logic ZERO is read, then the ground potential of the driver circuits is loaded. Hence, in the semiconductor circuit according to the invention, the ground potential of the load supply network (ground potential of the actual logic circuits) is connected, while a logic ONE is being read, to the ground potential of the driver supply network (ground potential of the driver circuits), and is thus stabilized. Accordingly, when a logic ZERO is being read, the positive supply potential of the load supply network is connected to the positive supply potential of the driver supply network. By alternatively connecting the different supply lines in this way, the noise on the supply lines for the load circuits can be considerably reduced.

In accordance with an added feature of the invention, the supply paths of the at least two supply networks supply the same potential when in operation, and the ground paths of the at least two supply networks have the same potential when in operation.

In an embodiment of the invention that is preferred in terms of circuitry, the coupling element is a switching transistor that is monolithically integrated in the semiconductor circuit.

The inventive semiconductor circuit with the compensating circuit is particularly suitable for digital semiconductor circuits with high clock frequencies, for example digital DRAM memory components or SDRAM semiconductor components.

Other features which are considered as characteristic for the invention are set forth in the appended claims.

Although the invention is illustrated and described herein as embodied in an integrated semiconductor circuit having at least two supply networks, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a waveform graph of measured voltage waveforms explaining the advantageous effects of the compensating circuit shown in FIG. 2.

DESCRIPTION OF THE PREFERRED EMBODIMENTS

Figure 1:
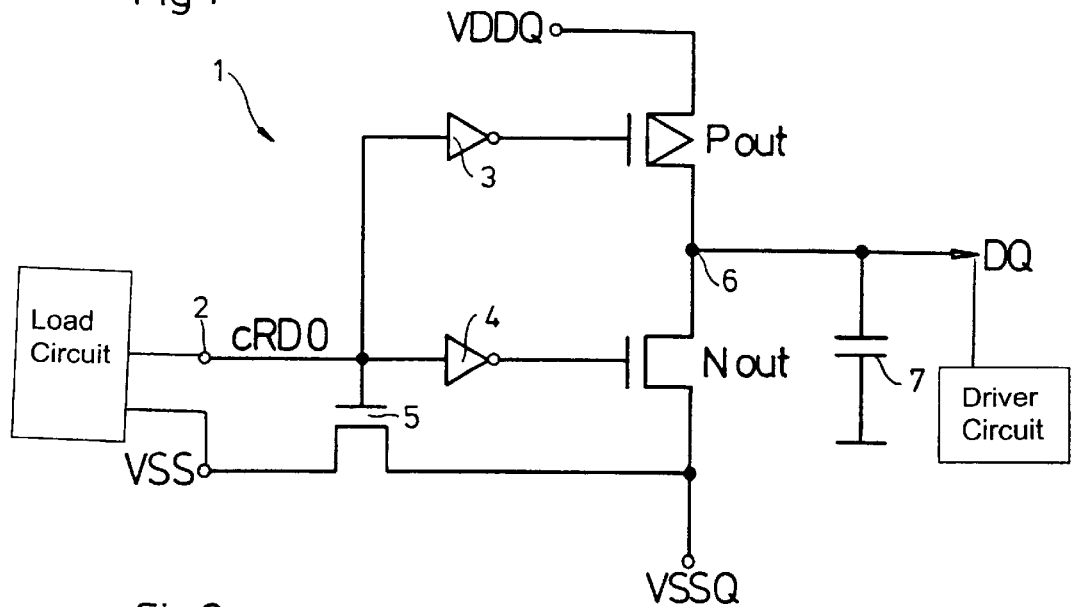
FIG. 1 is a diagrammatic circuit diagram of a compensating circuit for coupling ground paths VSS and VSSQ according to the invention.

In all the figures of the drawing, sub-fratures and integral parts that correspond to one another bear the same reference symbol in each case. Referring now to the figures of the drawing in detail and first, particularly, to FIG. 1 thereof, there is shown a first exemplary embodiment of the invention. The invention includes a compensating circuit 1 for alternately connecting a ground path VSS of a first supply network for the load circuits (digital logic circuits formed on the semiconductor chip) to a ground path VSSQ of a second supply network for driver circuit (particularly for output drivers). The compensating circuit 1 has a logic circuit that has two invertor stages 3, 4 and at whose input 3 detects a load on the supply network in the form of a potential value corresponding to logic ONE or logic ZERO. The compensating circuit 1 responds to the detected load by controlling a coupling element 5 so as to make an electrical connection between the ground paths 5 so as to make an electrical connection between the ground paths VSS and VSSQ. In this embodiment, the coupling element 5 is switching transistor 5 (an n-channel field effect transistor pout and an n-channel field effect transistor Nout are connected on series between VDDQ (supply path of the second supply network) and VSSQ. The output node 6 being connected to load circuits illustrated schematically as a capacitance 7.

The compensating circuit 1 operates as follows. If a logic ONE level is detected at the input 2, for example as a result of a logic ONE being read from the memory cell of a memory circuit disposed on the semiconductor chip, the transistor Pout switches on and connects the output DQ to the supply path VDDQ. The VDDQ network is thus loaded and therefore fluctuates. The ground path VSSQ remains stable in this event, so that the ground path VSS can be stabilized with the ground path VSSQ. To this end, the switching transistor 5 switches on and connects VSS to VSSQ. In contrast, if the input 2 is at the logic ZERO level, for example as a result of a logic ZERO being read from the memory cell, then the ground path VSSQ fluctuates severely because the switching transistor 5 is now switched off wherein the paths VSS and VSSQ are therefore disconnected, and the fluctuations of the ground path VSSQ are not transmitted to the path VSS.

Figure 2:
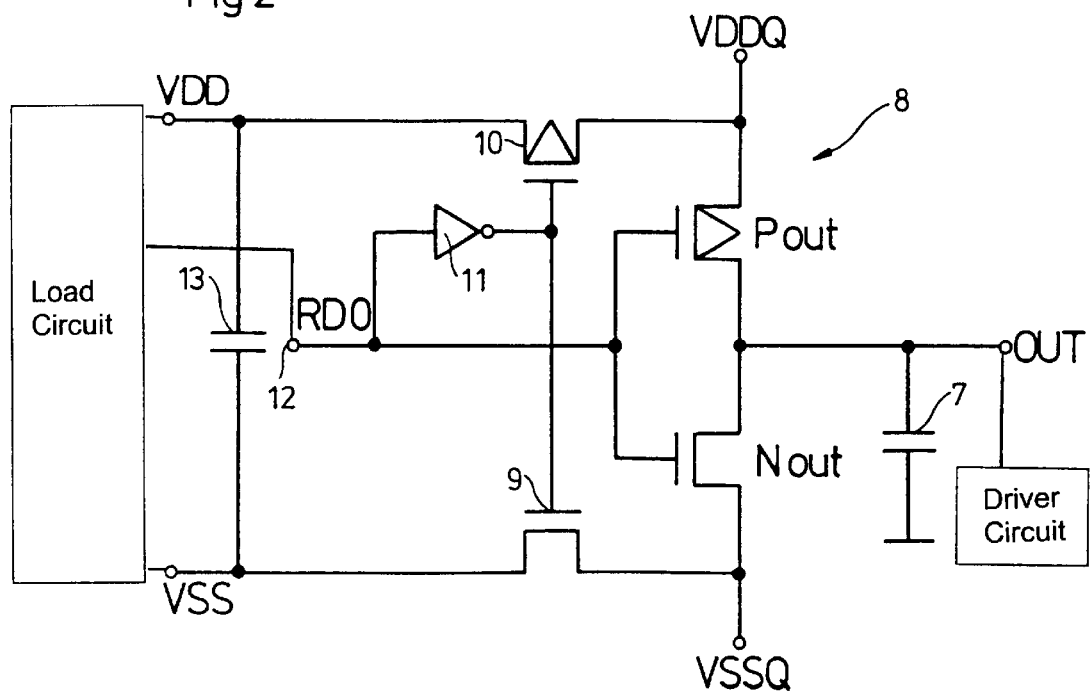
FIG. 2 is a circuit diagram of a further compensating circuit for coupling the ground paths VSS and VSSQ and supply paths VDD and VDDQ.

FIG. 2 shows a simplified circuit diagram of a further exemplary embodiment of the invention having a compensating circuit 8 for alternatively coupling the paths of the two supply networks VSS and VDD. Accordingly, two coupling elements are provided in the form of an n-channel field effect transistor 9 and a p-channel field effect transistor 10, the gate connections of the transistors are connected to an input 12 via an invertor 11. The input 12 is connected, by way of example, to a line RD0 of the storage component (in contrast, this is the complementary line cRD0 in the embodiment shown in FIG. 1, i.e. the correspondingly complementary logic values can be seen here). In turn, Pout denotes a p-channel field effect transistor, Nout an n-channel field effect transistor and OUT is an output of the circuit 8. Reference numeral 7 is again a schematic representation of the load circuits in the form of a capacitance. The reference numeral 13 denotes a damping capacitance between the paths VSS and VDD, which affords the additional advantage that the paths VSS and VDD are mutually stabilized. Operation is as follows. If a logic level ONE is detected at the input 12, for example as a result of a logic ZERO being read from the memory cell of the memory circuit disposed on the semiconductor chip, the transistor 9 switches off and the transistor 10 switches on. The path VDD is coupled to VDDQ, and the network VSSQ is loaded at the output OUT. Conversely, if a logic ZERO is present at the input 12, for example if a logic ONE is read from the memory cell, the transistor 9 switches on and the transistor 10 is off. The path VSS is coupled to the path VSSQ, and the output OUT loads the network VDDQ.

FIG. 3 is a schematic illustration of the voltage waveforms for the circuit shown in FIG. 2 when a logic ONE is read from the memory cell. In this case, the signal RD0 at the input 12 changes to logic ZERO, and the network VDDQ is loaded and fluctuates, while the network VSSQ remains comparatively stable. Without the inventive measure, the voltage waveforms on the paths VDD and VSS would follow the shape of the curves 14 and 15, where the amplitude of the fluctuations is approximately 300 to 400 mV. With the circuit measure according to the invention, the fluctuations are reduced approximately by a factor of 2 and are shown by curves 16 and 17.

I claim:

1. An integrated semiconductor circuit, comprising:
   at least two supply networks supplied independently of one another including a load supply network associated with a load circuit and a driver supply network associated with a driver circuit, said at least two supply networks including ground paths and supply paths and each of said at least two supply networks having a ground path with ground lines and a supply path with supply potential lines separate from said ground path; and
   a compensating circuit using one transistor for alternatively coupling and decoupling said ground paths of said at least two supply networks to one another.

2. The semiconductor circuit according to claim 1, wherein said supply paths of said at least two supply networks supply a same potential when in operation.

3. The semiconductor circuit according to claim 1, wherein said ground paths of said at least two supply networks have a same potential when in operation.

4. The semiconductor circuit according to claim 1 wherein said compensating circuit has a logic circuit detecting a load on one of said at least two supply networks in a form of a predetermined logic value and a coupling element controlled by said predetermined logic value, said coupling element making an electrical connection between said ground paths of said at least two supply networks.

5. The semiconductor circuit according to claim 4 wherein said coupling element is a switching transistor monolithically integrated in said compensating circuit.

6. The semiconductor circuit according to claim 1, wherein the semiconductor circuit is a digital semiconductor circuit.

7. An integrated semiconductor circuit, comprising:
   at least two supply networks supplied independently of one another including a load supply network associated with a load circuit and a driver supply network associated with a driver circuit, said at least two supply networks including ground paths and supply paths and each of said at least two supply networks having a ground path with ground lines and a supply path with supply potential lines separate from said ground path; and
   a compensating circuit using one transistor for alternatively coupling and decoupling said supply paths of said at least two supply networks to one another.

8. The semiconductor circuit according to claim 7, wherein said supply paths of said at least two supply networks supply a same potential when in operation.

9. The semiconductor circuit according to claim 7, wherein said ground paths of said at least two supply networks have a same potential when in operation.

10. The semiconductor circuit according to claim 7, wherein said compensating circuit has a logic circuit detecting a load on one of said at least two supply networks in a form of a predetermined logic value and a coupling element controlled by said predetermined logic value said coupling element making an electrical connection between said supply paths of said at least two supply networks.

11. The semiconductor circuit according to claim 10, wherein said coupling element is a switching transistor monolithically integrated in said compensating circuit.

12. The semiconductor circuit according to claim 7, wherein the semiconductor circuit is a digital semiconductor circuit.

13. An integrated semiconductor circuit, comprising:
at least two supply networks supplied independently of one another including a load supply network associated with a load circuit and a driver supply network associated with a driver circuit, said at least two supply networks including ground paths and supply paths and each of said at least two supply networks having a ground path with ground lines and a supply path with supply potential lines separate from said ground path; and
a compensating circuit using one transistor for alternatively coupling and decoupling said ground paths of said at least two supply networks to one another and using another transistor for alternatively coupling and decoupling said supply paths of said at least two supply networks to one another.

14. The semiconductor circuit according to claim 13, wherein said supply paths of said at least two supply networks supply a same potential when in operation.

15. The semiconductor circuit according to claim 13, wherein said ground paths of said at least two supply networks have a same potential when in operation.

16. The semiconductor circuit according to claim 13, wherein said compensating circuit has a logic circuit detecting a load on one of said at least two supply networks in a form of a predetermined logic value and a coupling element controlled by said predetermined logic value, said coupling element making an electrical connection between said supply paths of said at least two supply networks.

17. The semiconductor circuit according to claim 16, wherein said coupling element is a switching transistor monolithically integrated in said compensating circuit.

18. The semiconductor circuit according to claim 13, wherein the semiconductor circuit is a digital semiconductor circuit.

* * * * *